United States Patent
Jung et al.

(10) Patent No.: US 6,766,264 B2
(45) Date of Patent: Jul. 20, 2004

(54) METHOD AND APPARATUS FOR CALIBRATING PARAMETERS TO BE USED IN A DIGITAL CIRCUIT SIMULATION

(75) Inventors: Dae Suk Jung, Santa Clara, CA (US); Kyung Lee, Santa Clara, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 74 days.

(21) Appl. No.: 10/211,681

(22) Filed: Aug. 2, 2002

(65) Prior Publication Data

US 2004/0024554 A1 Feb. 5, 2004

(51) Int. Cl.[7] ............................................. G06F 11/00
(52) U.S. Cl. ............................ 702/107; 702/191; 716/4
(58) Field of Search .......................... 702/107, 57–59, 702/64, 65, 69, 117, 118, 111, 124, 126, 189, 147, 143–145; 716/4–6, 1, 12, 13; 703/13–15, 19, 28, 20; 324/613, 614

(56) References Cited

U.S. PATENT DOCUMENTS 6,029,117 A * 2/2000 Devgan ........................ 702/58
6,499,131 B1 * 12/2002 Savithri et al. ................ 716/5
6,523,149 B1 * 2/2003 Mehrotra et al. .............. 716/4
6,536,022 B1 * 3/2003 Aingaran et al. .............. 716/5

OTHER PUBLICATIONS

Ding et al., "Crosstalk noise estimation using effective coupling capacitance", IEEE, International Symposium on Circuits and Systems, May 26–29, 2002, vol. 5, pp. V–645–V–648.*

Chen et al., "Aggressor alignment for worst–case crosstalk noise", IEEE, IEEE Transactions on Computer–Aided Design of Integrated Circuits and Systems, May 2001, vol. 20, issue 5, pp. 612–621.*

* cited by examiner

Primary Examiner—Hal D Wachsman
(74) Attorney, Agent, or Firm—Park, Vaughan & Fleming LLP; Edward J. Grundler

(57) ABSTRACT

One embodiment of the present invention provides a system for calibrating a model of a digital circuit to account for noise effects between signal lines. The system operates by first fabricating a digital circuit for calibration purposes. Next, an input signal is applied to an aggressor net within the digital circuit. The system then measures how noise from the input signal affects the amplitude of a signal on a victim net within the digital circuit. Finally, the system adjusts parameters of the circuit model using the measured results.

12 Claims, 4 Drawing Sheets

| NOISE | F4 | F5 | F6 | F7 |
|-------|----|----|----|----|
| 300mv | 0  | 0  | 0  | 0  |
| 400mv | 1  | 0  | 0  | 0  |
| 500mv | 1  | 1  | 0  | 0  |
| 600mv | 1  | 1  | 1  | 0  |
| 700mv | 1  | 1  | 1  | 1  |
FIG. 2
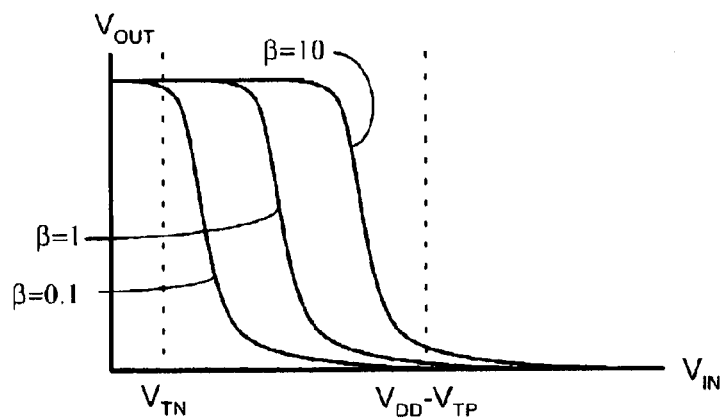
FIG. 3
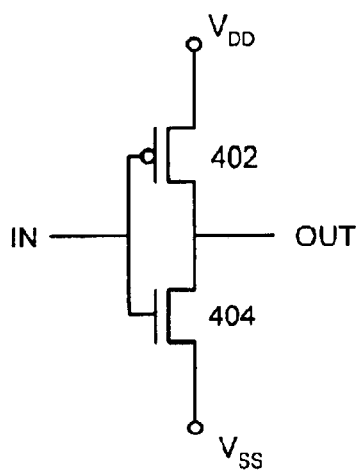
FIG. 4

500 mV
NOISE SIGNAL
ON VICTIM NET 104

OUTPUT OF
INVERTER 110

OUTPUT OF
INVERTER 112

OUTPUT OF
INVERTER 118

OUTPUT OF
INVERTER 120

OUTPUT OF
INVERTER 126

OUTPUT OF
INVERTER 128

METHOD AND APPARATUS FOR CALIBRATING PARAMETERS TO BE USED IN A DIGITAL CIRCUIT SIMULATION

BACKGROUND

1. Field of the Invention

The present invention relates to the process of simulating digital circuits. More specifically, the present invention relates to a method and an apparatus for calibrating parameters of a model to be used in a simulation of a digital circuit.

2. Related Art

As integrated circuits continue to increase in density and operating speed, they are becoming more sensitive to noise caused by inductive and capacitive coupling between signal lines. This noise can interfere with the operation of an integrated circuit and hence must be considered during the process of routing of signal lines within the digital circuit.

Circuit designers typically use a computer-based model of a digital circuit to determine the effects of various circuit parameters, including inductive and capacitive noise, on performance of the digital circuit. The results of these circuit simulations can be used to verify that the digital circuit meets performance targets, and to iteratively adjust the design of the digital circuit.

Unfortunately, there presently exists no accurate way to determine the magnitude of the noise coupling parameters to be used in such a computer-based model. This leads circuit designers to make rough estimates of such noise coupling parameters or to ignore such parameters in developing a model. Hence, when the results determined from the model do not match the results measured from the physical circuit, there is no clear way to determine how to adjust the parameters to more accurately model the digital circuit.

What is needed is a method and an apparatus for accurately calibrating parameters to be used in a simulation of a digital circuit.

SUMMARY

One embodiment of the present invention provides a system for calibrating a model of a digital circuit to account for noise effects between signal lines. The system operates by first fabricating a digital circuit for calibration purposes. Next, an input signal is applied to an aggressor net within the digital circuit. The system then measures how noise from the input signal affects the amplitude of a signal on a victim net within the digital circuit. Finally, the system adjusts parameters of the circuit model using the measured results.

In a variation on this embodiment, measuring how noise affects the amplitude of the signal on the victim net involves using multiple level detectors to quantize the signal on the victim net. The system then digitizes the output of these level detectors.

In a further variation, a given level detector includes a complementary metal oxide semiconductor inverter circuit.

In a further variation, the detection level of a given level detector is established by adjusting the beta of the complementary metal oxide semiconductor inverter circuit.

In a further variation, the system adjusts the beta by adjusting the ratio of $\omega_p$ to $\omega_n$.

In a further variation, each level detector has a different beta.

In a further variation, a given level detector is followed by a series of inverters, which amplify and shape an output pulse.

In a further variation, digitizing the output of a given level detector involves latching the state of the last inverter of the series of inverters so that the state can be read to determine the output of the given level detector.

BRIEF DESCRIPTION OF THE FIGURES

FIG. 2 illustrates the output of a noise detecting circuit in accordance with an embodiment of the present invention.

FIG. 3 illustrates inverter transfer curves in accordance with an embodiment of the present invention.

FIG. 4 illustrates an inverter circuit in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Noise Detecting Circuit

Figure 1:
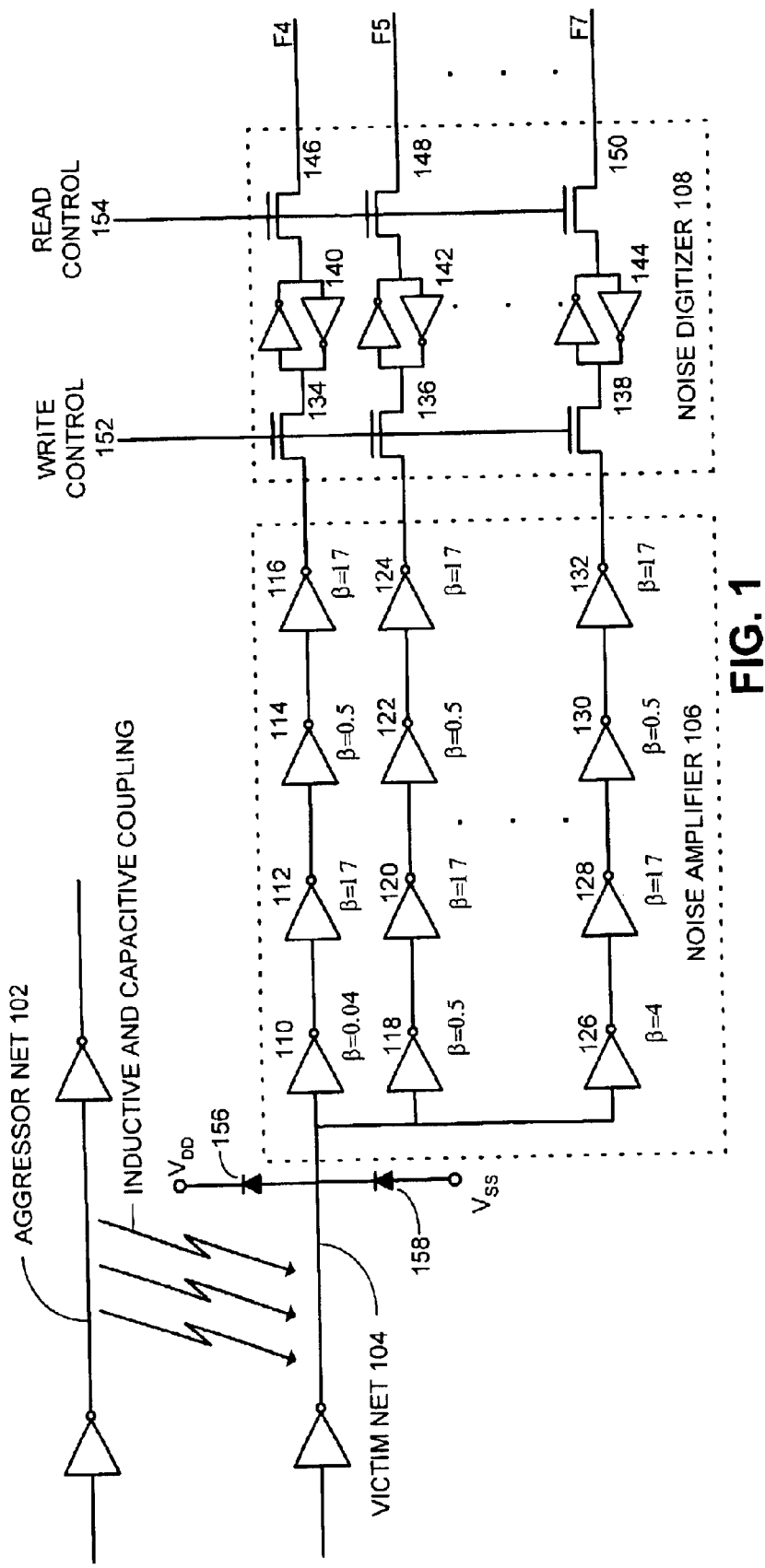
FIG. 1 illustrates a noise detecting circuit in accordance with an embodiment of the present invention.

FIG. 1 illustrates a noise detecting circuit in accordance with an embodiment of the present invention. The noise detecting circuit includes aggressor net 102, victim net 104, noise amplifier 106, noise digitizer 108, diodes 156 and 158. Note that there exists inductive and capacitive coupling from aggressor net 102 into victim net 104. Also note that diodes 156 and 158 limit the voltage extremes of noise signals coupled into victim net 104 so that the input circuits of noise amplifier 106 are not damaged.

Noise amplifier 106 includes inverters 110–132. Inverters 110–132 function as level detecting and pulse shaping circuits for several different levels of signal amplitude. For example, inverters 110–116 detect noise levels above 400 mV, inverters 118–124 detect signal amplitudes; above 500 mV, while inverters 126–132 detect signal amplitudes above 700 mV. Note that additional inverter chains can be added, if necessary, to detect other signal amplitudes.

The first inverter in each of the chains (110, 118, and 126) controls the detection level for the chain. Note that each of these first inverters adds a different β to detect a different signal amplitude level. For example, in one embodiment of the present invention, β is 0.04 for inverter 110, 0.5 for inverter 118, and 4 for inverter 126.

The remaining inverters in each chain shape any incoming signals into rectangular pulses for noise digitizer 108. For example, in the embodiment of the present invention illustrated in FIG. 1, inverters 112, 120, and 128 each have a β of 17; inverters 114, 122, and 130 each have a β of 0.5; and inverters 116, 124, and 132 each have a β of 17. This combination provides acceptable pulses for noise digitizer 108 when noise is detected.

The outputs of noise amplifier 106 are coupled to noise digitizer 108. Specifically, the output of inverter 116 is coupled to transistor 134, the output of inverter 124 is coupled to transistor 136, and the output of inverter 132 is coupled to transistor 138. Additional output inverters in noise amplifier 106 are similarly coupled to transistors in noise digitizer 108.

Noise digitizer 108 includes input transistors 134, 136, and 138; latches 140, 142, and 144; and output transistors 146, 148, and 150. The operation of noise digitizer 108 is controlled by write control signal 152 and read control signal 154. Write control signal 152 turns on transistors 134, 136, and 138 to sample the outputs of inverters 116, 124, and 132, respectively. When the input transistors are turned on, the state of inverters 116, 124, and 132 is transferred to latches 140, 142, and 144, respectively.

Latches 140, 142, and 144 are formed using back-to-back inverters, which hold their input state even after write control signal 152 turns off the input transistors 134, 136, and 138. Read control signal 154 turns on output transistors 146, 148, and 150 which makes the state of latches 140, 142, and 144 available at outputs F4, F5, and F7, respectively.

Noise Detecting Circuit Output

FIG. 2 illustrates the output of a noise detecting circuit in accordance with an embodiment of the present invention. Outputs F4, F5, F6, and F7 detect signal amplitudes of 400 mV, 500 mV, 600 mV, and 700 mV, respectively. Note that F6 is not shown in FIG. 1 but would include similar circuitry to that used for generating F4, F5, and F7.

As shown in FIG. 2, an input signal amplitudes of 300 mV results in signals F4, F5, F6, and F7 all being zero. When the input signal amplitude is 400 mV, F4 is one, while F5, F6, and F7 are zero. Thus, an output of 1000 on F4, F5, F6, and F7 indicates that the noise is at least 400 mV but is not 500 mV. Each increase of input noise level above the next threshold sets the next output to one. Thus, an output of 1110 on F4, F5, F6, and F7 indicates that the signal amplitude is at least 600 mV but is not 700 mV, while an output of 1111 indicates that the signal amplitude is greater than 700 mV.

Transfer Curves

FIG. 3 illustrates inverter transfer curves in accordance with an embodiment of the present invention. FIG. 3 displays $V_{OUT}$ VS $V_{IN}$ for several values of β. $V_{TN}$ indicates the threshold voltage for the N-type transistor while $V_{TP}$ indicates the threshold voltage for the P-type transistor. $V_{TN}$ indicates the lowest level of detectable noise, while $V_{DD}-V_{TP}$ indicates the highest level of detectable noise.

The different levels of β control the detection level of the inverters. For example, when β is 0.1, a relatively small noise signal will cause the inverter to change state. When β is 10, however, a relatively large signal is needed to cause the inverter to change state. Controlling β, therefore, allows the inverters to be tailored to respond to specific levels of noise.

Inverter Circuit

FIG. 4 illustrates an inverter circuit in accordance with an embodiment of the present invention. As shown in FIG. 4, the inverter includes P-type transistor 402 and N type transistor 404. The basic operation of the inverter is well known in the art and will not be discussed in detail herein. However, the method for establishing β for a given inverter is of interest. β is the ratio of the width parameter $\omega_p$ of the P-type transistor to the width parameter $\omega_N$ of the N-type transistor or $\omega_P/\omega_N$. Thus, controlling the detection levels in noise amplifier 106 involves simply adjusting the width parameters appropriately.

Calibrating a Circuit

Figure 5:
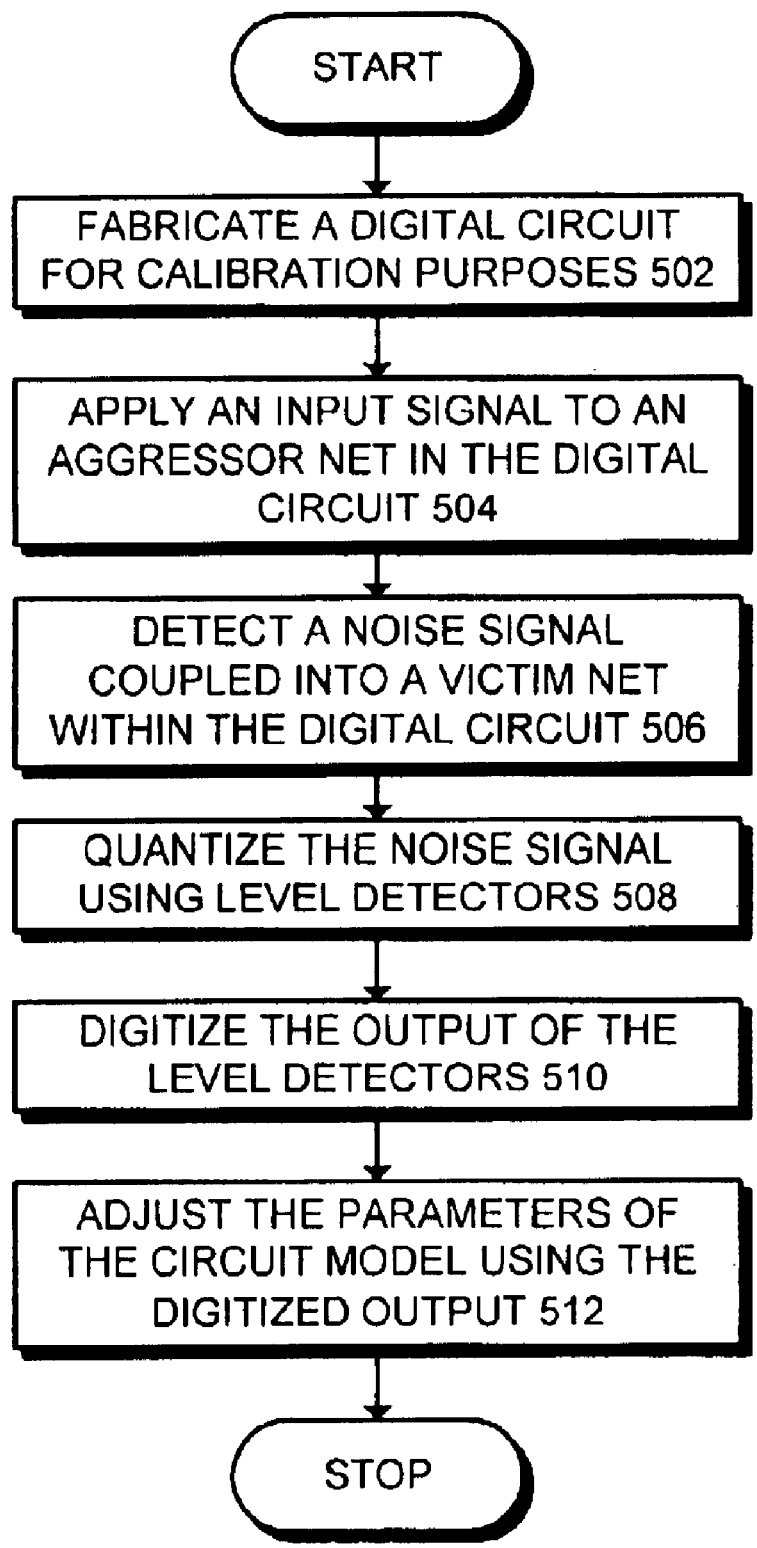
FIG. 5 is a flowchart illustrating the process of calibrating a circuit model in accordance with an embodiment of the present invention.

FIG. 5 is a flowchart illustrating the process of calibrating a circuit model in accordance with an embodiment of the present invention. The system starts when a digital circuit is fabricated for calibration purposes (step 502). Next, an input signal is applied to an aggressor net within the digital circuit (step 504).

Noise amplifier 106 then detects a signal that is coupled into a victim net within the digital circuit (step 506). After detecting the signal, the signal is quantized by noise amplifier 106 (step 508). Next, noise digitizer 108 digitizes the output of noise amplifier 106 (step 510). Finally, the digitized output from noise digitizer 108 is used to adjust the parameters of the circuit model (step 512). This can be accomplished by iteratively adjusting inductive and capacitive coupling parameters in the circuit model until the output of the model matches the measured output of the digital circuit.

Signals

Figure 6:
FIG. 6 illustrates signals at various points within noise amplifier 106 in accordance with an embodiment of the present invention.
Figure 6:
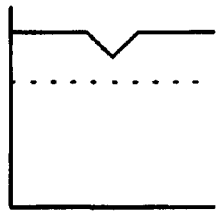
Figure 6:
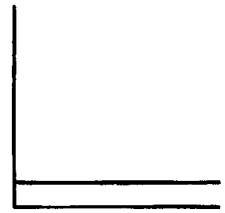
Figure 6:
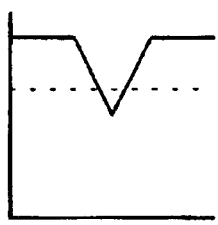
Figure 6:
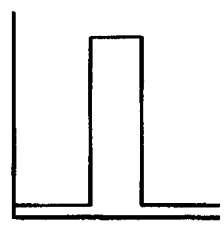
Figure 6:
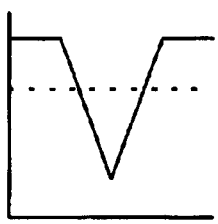
Figure 6:
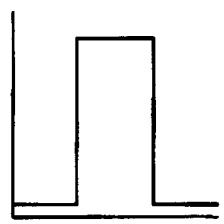

FIG. 6 illustrates signals at various points within noise amplifier 106 in accordance with an embodiment of the present invention. Specifically, FIG. 6 illustrates signals with an amplitude of 500 mV on victim net 104. The output of inverters 110, 118, and 126 are shown. Note that these outputs depend on the β of the respective inverters. The dashed line on each chart illustrates the threshold voltage $V_T$ of the following inverter. The output of inverters 112, 120, and 128 are also shown. Note that the output of inverter 112 remains constant because the output of inverter 110 is below the $V_T$ of inverter 112. The outputs of inverters 120 and 128, however, are rectangular pulses because the outputs of inverters 118 and 126, respectively, are above $V_T$.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that facilitates calibrating a model for a digital circuit to account for noise effects between signal lines, comprising:
   a digital circuit;
   a victim net within the digital circuit,
   an aggressor net within the digital circuit, wherein the aggressor net is configured to induce a noise signal on the victim net;
   a noise amplifier coupled to the victim net, wherein the noise amplifier is configured to detect the noise signal coupled into the victim net, and wherein the noise amplifier includes a plurality of level detectors, each level detector configured to detect a different noise level; and
   a digitizer configured to digitize an output of the noise amplifier
   wherein an output from the digitizer is used to adjust the parameters of the model for the digital circuit.

2. The apparatus of claim 1, wherein a level detector of the plurality of level detectors includes a complementary metal oxide semiconductor inverter circuit.

3. The apparatus of claim 2, wherein a detection level of the level detector is established by adjusting a beta of the complementary metal oxide semiconductor inverter circuit.

4. The apparatus of claim 3, further comprising adjusting the beta by adjusting a ratio of $\omega_p$ to $\omega_n$.

5. The apparatus of claim 4, wherein each level detector within the plurality of level detectors has a different beta.

6. The apparatus of claim 2, further comprising a series of inverters following each level detector, wherein the series of inverters amplify and shape an output pulse.

7. The apparatus of claim 6, further comprising a latch circuit configured to latch a state of a list inverter of the series of inverters so that the state can be read to determine the output of the level detector.

8. An apparatus that facilitates calibrating a model for a digital circuit to account for noise effects between signal lines, comprising:

a digital circuit;

a victim net within the digital circuit;

an aggressor net within the digital circuit, wherein the aggressor net is configured to induce a noise signal on the victim net;

a noise amplifier coupled to the victim net, wherein the noise amplifier is configured to detect the noise signal coupled into the victim net;

wherein the noise amplifier further comprises a plurality of level detectors, wherein each level detector is set to detect a specified level of noise;

a series of inverters following each level detector, wherein the series of inverters amplify and shape an output pulse;

a digitizer configured to digitize an output of the noise amplifier; and a latch circuit configured to latch a state of a last inverter of the series of inverters so that the state can be read to determine the output of the level detector;

wherein a latched output from the latch circuit is used to adjust the parameters of the model for the digital circuit.

9. The apparatus of claim 8, wherein a level detector of the plurality of level detectors includes a complementary metal oxide semiconductor inverter circuit.

10. The apparatus of claim 9, wherein a detection level of the level detector is established by adjusting a beta of the complementary metal oxide semiconductor inverter circuit.

11. The apparatus of claim 10, further comprising adjusting the beta by adjusting a ratio of $\omega_p$ to $\omega_n$.

12. The apparatus of claim 11, wherein each level detector within the plurality of level detectors has a different beta.

* * * * *

UNITED STATES PATENT AND TRADEMARK OFFICE
CERTIFICATE OF CORRECTION

PATENT NO. : 6,766,264 B2
DATED : July 20, 2004
INVENTOR(S) : Dae Suk Jung and Kyung Lee It is certified that error appears in the above-identified patent and that said Letters Patent is hereby corrected as shown below:

Column 5,
Line 7, please delete the word, "list" and replace with the word -- last --.

Signed and Sealed this

Thirtieth Day of November, 2004

JON W. DUDAS
*Director of the United States Patent and Trademark Office*